(12) United States Patent
Kommrusch et al.

(10) Patent No.: US 8,884,663 B2
(45) Date of Patent: Nov. 11, 2014

(54) STATE MACHINE FOR LOW-NOISE CLOCKING OF HIGH FREQUENCY CLOCK

(71) Applicant: Advanced Micro Devices, Inc., Sunnyvale, CA (US)

(72) Inventors: Steven J. Kommrusch, Fort Collins, CO (US); Zihno Jusufovic, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/776,489

(22) Filed: Feb. 25, 2013

(65) Prior Publication Data

US 2014/0240009 A1    Aug. 28, 2014

(51) Int. Cl.
*H03K 21/00* (2006.01)
*H03K 23/00* (2006.01)
*H03K 25/00* (2006.01)
*H03K 21/02* (2006.01)

(52) U.S. Cl.
CPC .................................... *H03K 21/023* (2013.01)
USPC ............. 327/115; 327/113; 327/39; 327/116; 377/47; 377/48

(58) Field of Classification Search
CPC ..... H03K 23/00; H03K 23/58; H03K 23/582; H03K 23/584; H03K 23/60; H03K 23/64; H03K 23/70; H03K 5/00006; H03B 19/00; H03B 19/10; H03B 19/12; H03B 19/14

USPC ....................... 327/113–117, 119, 122, 39–40, 327/156–158, 42–45; 377/47, 48
See application file for complete search history.

(56) References Cited

U.S. PATENT DOCUMENTS

| | | | |
|---|---|---|---|
| 5,909,144 A | 6/1999 | Puckette | |
| 6,954,886 B2 * | 10/2005 | Tu et al. | 714/726 |
| 7,012,454 B2 * | 3/2006 | Matsui et al. | 327/114 |
| 2005/0138444 A1 | 6/2005 | Gaskins | |
| 2009/0106720 A1 | 4/2009 | Nagata | |
| 2009/0262877 A1 | 10/2009 | Shi et al. | |

FOREIGN PATENT DOCUMENTS

JP      2000216667 A    8/2000

OTHER PUBLICATIONS

International Search Report for PCT/US2014/015005; Jun. 3, 2014.

* cited by examiner

*Primary Examiner* — Lincoln Donovan
*Assistant Examiner* — Thomas Skibinski
(74) *Attorney, Agent, or Firm* — Williams Morgan, P.C.

(57) ABSTRACT

Methods, apparatus, and fabrication techniques relating to management of noise arising from capacitance in a clock tree of an integrated circuit. In some embodiments, the methods comprise receiving a signal to adjust a clock having a first rate to a second rate; and ramping, in response to receiving the signal, the clock from the first rate to the second rate, wherein the ramping comprises changing the frequency of the clock to at least one third rate between the first and second rates.

16 Claims, 7 Drawing Sheets

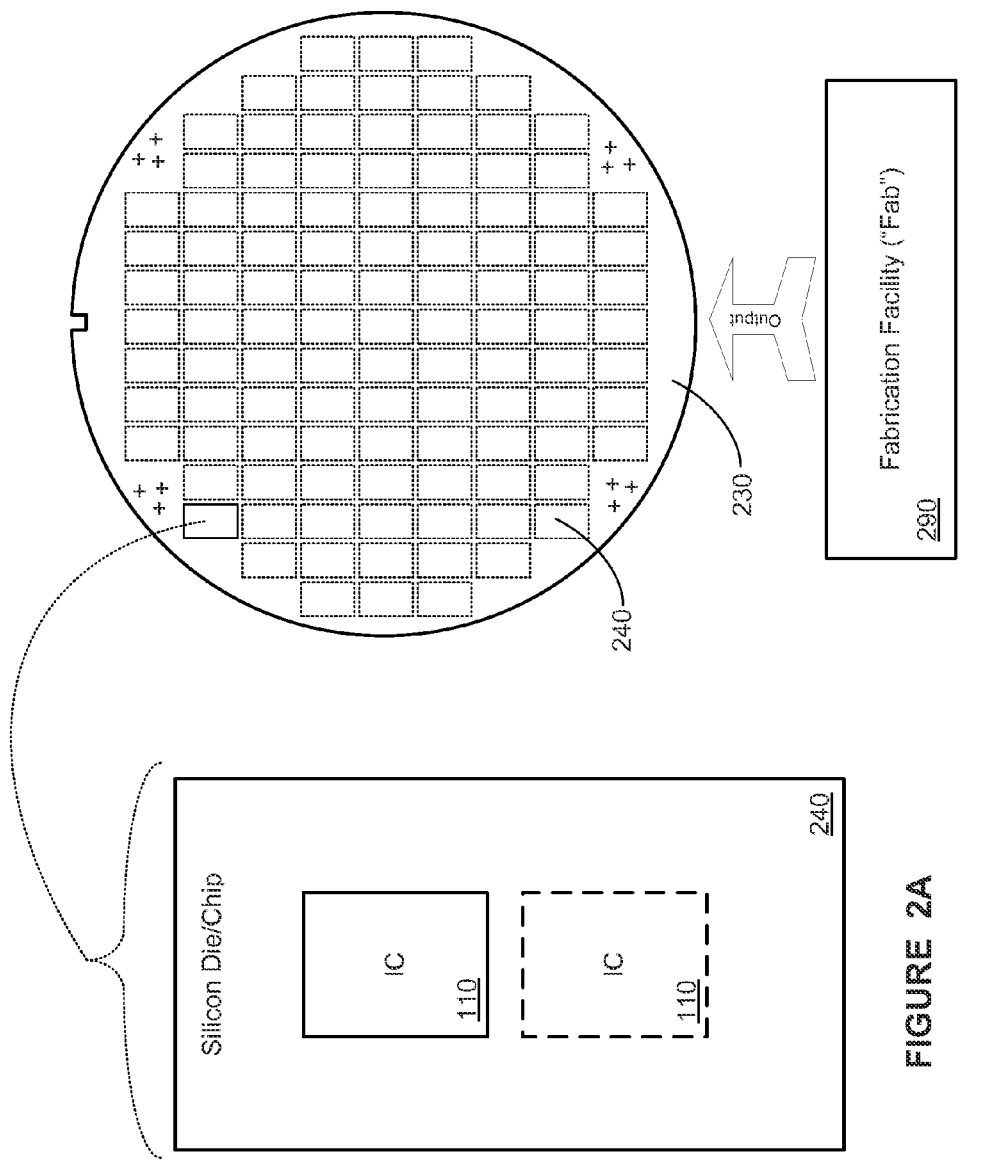

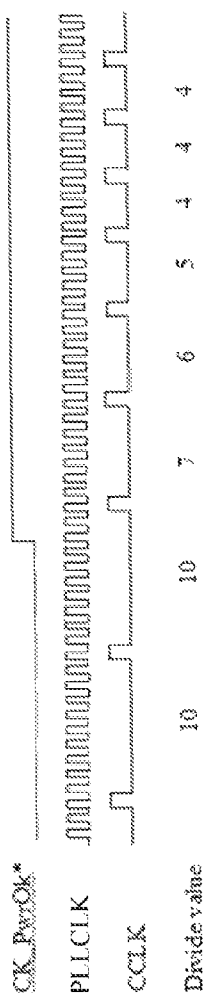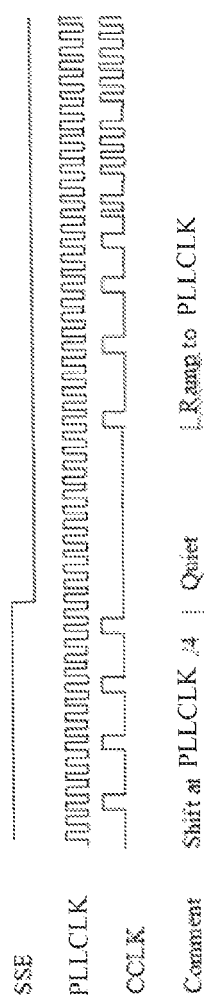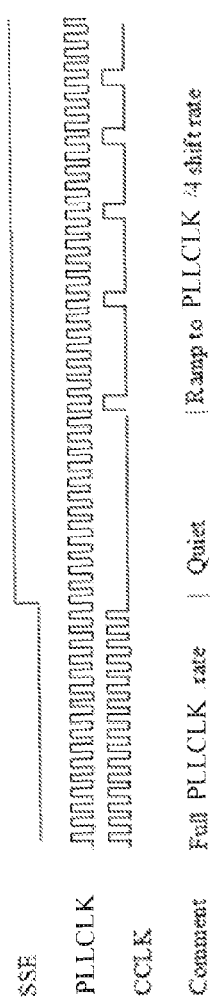

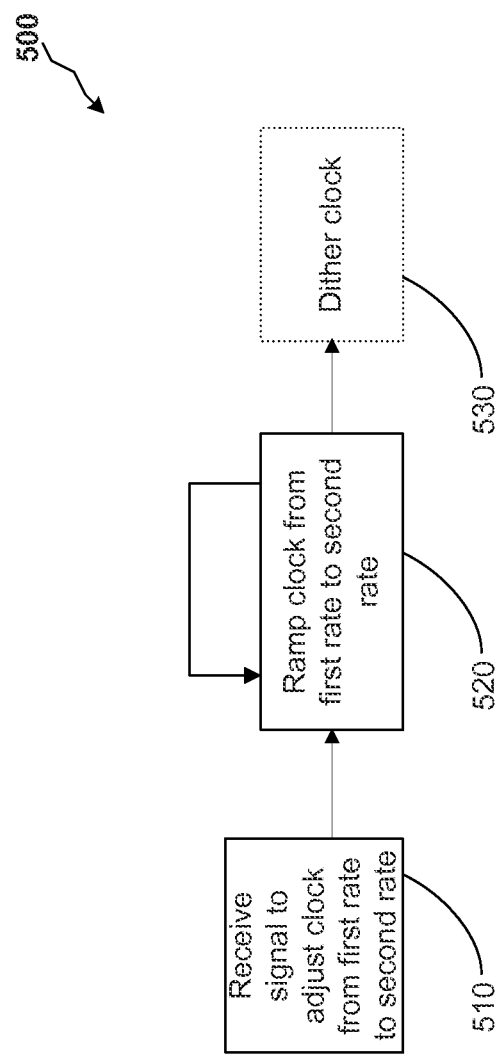

US 8,884,663 B2

STATE MACHINE FOR LOW-NOISE CLOCKING OF HIGH FREQUENCY CLOCK

BACKGROUND

1. Technical Field

Generally, the present disclosure relates to integrated circuits, and, more particularly, to reductions in noise arising from capacitance of integrated circuit clock trees.

2. Description of the Related Art

Integrated circuits require clock signals to ensure synchronous and effectual operation of their various components. Typically, a phase-locked loop (PLL) provides a synchronized version of a clock signal, and a clock mesh or clock tree distributes various versions of the clock signal to the various components of the integrated circuit. In light of the high power and high frequencies of typical modern clock trees may have to deal with noise issues. For example, clock trees generate significant capacitance, which may give rise to noise that may interfere with proper operation of one or more components of the integrated circuit. Such noise may especially be pronounced during clock gating (e.g., clock enabling, clock disabling) and reset sequencing (e.g., warm resets, scan tests).

Specifically, current consumed in a clock grid can be determined from the equation I=CVF, where C is the clock capacitance, F is the frequency, and V is the voltage. If the frequency of a clock is changed very quickly, such as by rapidly going from a clock-off state to the multiple GHz clock frequencies known for many modern CPUs, the dI/dT will be very high, thus potentially generating noise as discussed above. One source of voltage noise in modern silicon is the die-to-package inductance. Voltage over an inductance L is equal by definition to V=LdI/dT. Voltage noise impacts the speed at which a processor may run.

Known techniques for managing noise in clock trees are undesirably slow for use in modern integrated circuit devices, e.g., computer systems.

SUMMARY OF EMBODIMENTS OF THE DISCLOSURE

The apparatuses, systems, and methods in accordance with some embodiments of the present disclosure may manage noise arising in clock meshes during clock state transitions by ramping up or down clock signals. By reducing the rate of change in the frequency of a clock while still allowing fast and complex clock control behaviors, voltage noise may be reduced. Mechanisms controlling and implementing such clock signal management may be formed within a microcircuit by any means, such as by growing or deposition.

An apparatus in accordance with some embodiments of the present disclosure includes: a clock having a first rate; and a processor configured to: receive a signal to adjust a clock having a first rate to a second rate; and ramp, in response to receiving the signal, the clock from the first rate to the second rate, wherein the ramping comprises changing the frequency of the clock to at least one third rate between the first and second rates.

A method in accordance with some embodiments of the present disclosure comprises: receiving a signal to adjust a clock having a first rate to a second rate; and ramping, in response to receiving the signal, the clock from the first rate to the second rate, wherein the ramping comprises changing the frequency of the clock to at least one third rate between the first and second rates.

Some embodiments of the disclosure may be used in any type of integrated circuit that uses multiple compute units, a shared cache unit, and a power management unit. One example is a general purpose microprocessor.

BRIEF DESCRIPTION OF THE FIGURES

The disclosed subject matter will hereafter be described with reference to the accompanying drawings, wherein like reference numerals denote like elements, and:

FIG. 2A provides a representation of a silicon die/chip that includes one or more circuits as shown in FIG. 1, in accordance with some embodiments of the disclosure.

FIG. 2B provides a representation of a silicon wafer which includes one or more dies/chips that may be produced in a fabrication facility, in accordance with some embodiments of the disclosure.

FIG. 3A is a waveform diagram of various clock signals, in accordance with some embodiments of the disclosure.

FIG. 3B is a waveform diagram of various clock signals, in accordance with some embodiments of the disclosure.

FIG. 3C is a waveform diagram of various clock signals, in accordance with some embodiments of the disclosure.

FIG. 6 is a flowchart of a method relating to management of clock signals, in accordance with some embodiments of the disclosure.

Figure 1:
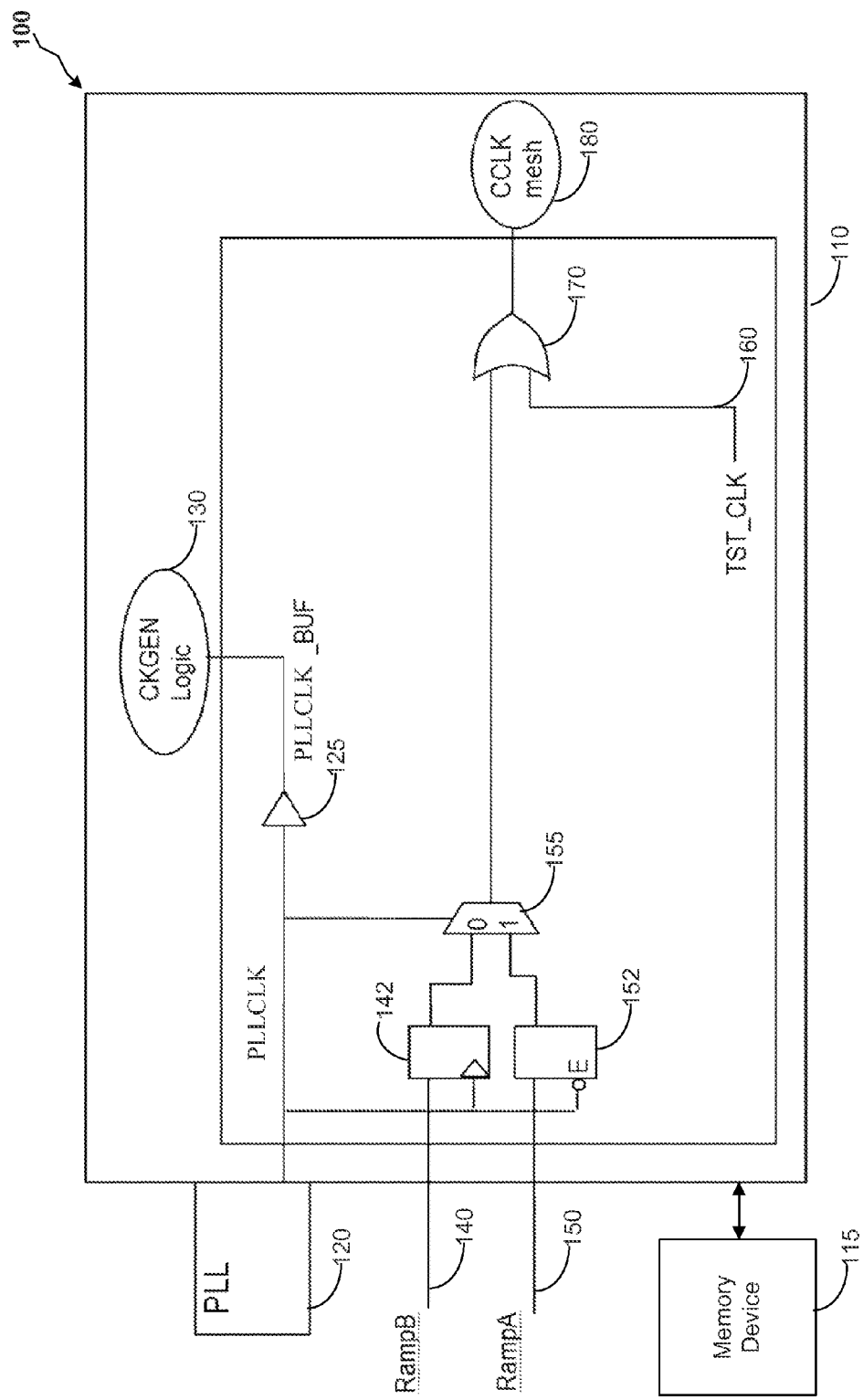
FIG. 1 is a simplified schematic diagram of an integrated circuit comprising a clock circuit in accordance with some embodiments of the disclosure.

While the disclosed subject matter is susceptible to various modifications and alternative forms, some embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

Some embodiments of the present disclosure provide for ramping of clocks in integrated circuit devices. By doing so, noise generated by clock gating and reset sequencing, arising from capacitance associated with the clock tree of an integrated circuit device, may be reduced, thereby improving performance of the integrated circuit device.

Turning now to FIG. 1, a block diagram, a stylized representation of components of a computer system 100, in accordance with some embodiments of the present disclosure, is illustrated. The computer system 100 may comprise at least an integrated circuit 110 and a memory device 115. Components of the integrated circuit 110 include, but are not limited to, a phase-locked loop (PLL) 120. The PLL 120 generates and distributes a clock PLLCLK. A buffer 125 may buffer the clock signal, resulting in a PLLCLK_BUF signal. A CKGEN logic 130 receives the PLLCLK_BUF signal and generates ramping signals, e.g., RampB 140 and RampA 150. A flip-flop 142 may clock through the RampB 140 signal. The flip-flop 142 may provide data to latch onto the rising edge of PLLCLK. An active low latch 152 may receive and act on the RampA 150 signal. The latch 152 may provide data to set up and hold based on the rising edge of PLLCLK. A mux 155 may act on signals received from flip-flop 142 and latch 152 and output a signal. An OR gate 170 may receive the signal output by mux 155. The OR gate 170 may also receive a clock signal relating to a testing mode, e.g., TST_CLK 160. The OR gate 170 outputs a CCLK signal to the CCLK mesh 180 of the integrated circuit 110.

Turning now to FIG. 2A, in some embodiments, the integrated circuit 110 may reside on a silicon die/chip 240. The silicon die/chip 240 may be housed on a motherboard or other structure of the computer system 100. In one or more embodiments, there may be more than one integrated circuit 110 on each silicon die/chip 240. Various embodiments of the integrated circuit 110 may be used in a wide variety of electronic devices.

Turning now to FIG. 2B, in accordance with some embodiments, and as described above, the integrated circuit 110 may be included on the silicon chip/die 240. The silicon chip/die 240 may contain one or more different configurations of the integrated circuit 110. The silicon chip/die 240 may be produced on a silicon wafer 230 in a fabrication facility (or "fab") 290. That is, the silicon wafer 230 and the silicon die/chip 240 may be referred to as the output, or product of, the fab 290. The silicon chip/die 240 may be used in electronic devices.

The circuits described herein may be formed on a semiconductor material by any known means in the art. Forming can be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the instant disclosure. As understood by one or ordinary skill in the art, it may be programmed into a computer, processor, or controller, which may then control, in whole or part, the operation of a semiconductor manufacturing facility (or fab) to create semiconductor products and devices. These tools may be used to construct the embodiments of the disclosure described herein.

Figure 3D:
FIG. 3D is a waveform diagram of various clock signals, in accordance with some embodiments of the disclosure.
Figure 3E:
FIG. 3E is a waveform diagram of various clock signals, in accordance with some embodiments of the disclosure.

FIGS. 3A-3E provide waveform diagrams for various situations. FIG. 3A shows waveforms for ramping CCLK from an initial clock value of PLLCLK/10 to PLLCLK/4. The PLLCLK/4 value may be suitable for a scan shift operation. FIG. 3B shows waveforms for ramping CCLK after scan shift from PLLCLK/4 to PLLCLK. FIG. 3C shows waveforms for switching CCLK from PLLCLK directly to scan shift at PLLCLK/4. FIG. 3D shows waveforms for ramping down CCLK when a gater is deasserted, allowing entry of the integrated circuit into a low-power mode. FIG. 3E shows waveforms for ramping up CCLK when a gater is asserted, allowing exit of the integrated circuit from the low-power mode.

FIGS. 3D-3E show a dither period of CCLK. "Dithering" is used herein to refer to a transfer of a clock from a first frequency to a second frequency over a period of time by use of a pattern of clock enable cycles intermediate between the two frequencies and ramping from the first frequency to the second frequency. The pattern of intermediate clock enable cycles may be random or preprogrammed. For example, FIG. 3D shows a dither down from a first frequency of CCLK (equal to PLLCLK) to a second frequency of CCLK (equal to PLLCLK/2). FIG. 3E shows a dither up from a first frequency of CCLK (equal to PLLCLK/2) to a second frequency of CCLK (equal to PLLCLK).

The clock dither may help smooth out medium-term current draw, thereby minimizing a di/dt event that would otherwise be expected to occur if changing from PLLCLK/2 to PLLCLK in a single step. For example, if the current were 2 A at full frequency and 1 A at half frequency, the average current over 4 cycles may be ramped gently using a dither pattern, such as one described below. This current ramp may give larger, off-die capacitors time to respond to the current change and may reduce a voltage droop from a sudden change.

Figure 4A:
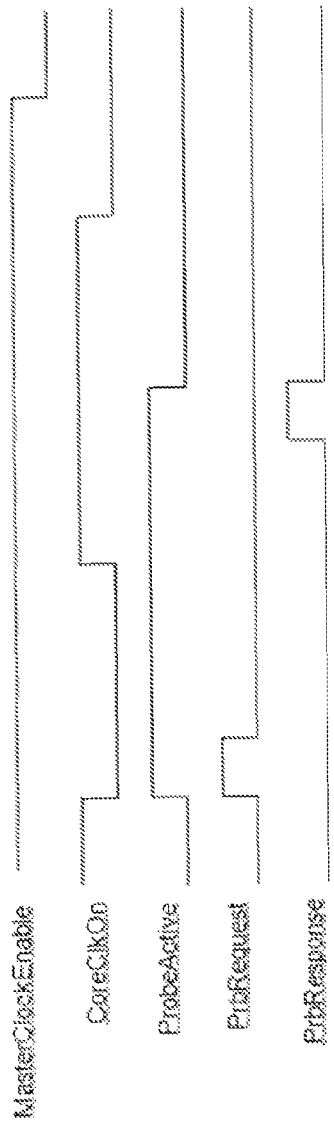
FIG. 4A is a waveform diagram of various clock signals, in accordance with some embodiments of the disclosure.
Figure 4B:
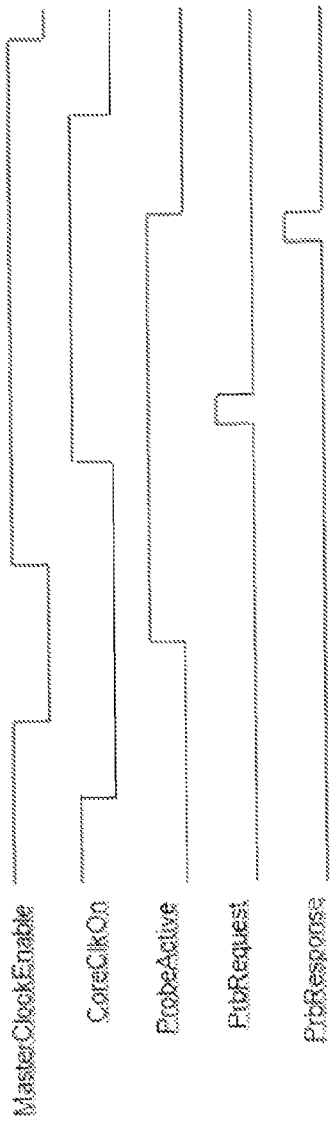
FIG. 4B is a waveform diagram of various clock signals, in accordance with some embodiments of the disclosure.

FIGS. 4A-4B provide waveform diagrams which may be used for probing the cache of a clock gated core or other compute unit. In FIG. 4A, a probe request (PrbRequest) may be made, for example, just as the clock control for a CPU core (CoreClkOn) was about to enter a clock gated state. The CoreClkOn signal may be held low to a probe state machine to insure that probes are quiesced before the actual clock is removed. In the depicted embodiment, since the PrbRequest is occurring, ProbeActive is set high and the MasterClockEnable is not lowered. After the probe completes (shown by PrbResponse set high and ProbeActive set low), the CoreClkOn in lowered and then, since ProbeActive is low, MasterClockEnable lowers.

In FIG. 4B, the clock control for a CPU core (CoreClkOn) has entered a clock gated state before a probe is requested. In this depicted scenario, both MasterClockEnable and CoreClkOn are set low. As a result, a probe state machine is configured to not send a PrbRequest, but instead, set ProbeActive high to signal the clock control logic that it should ramp up the clock. After the clock has ramped up (subsequent the rising edge of ProbeActive), CoreClkOn goes high and the probe request and response can occur. Once the probe is complete the clock can turn off again (CoreClkOn set low).

Figure 5:
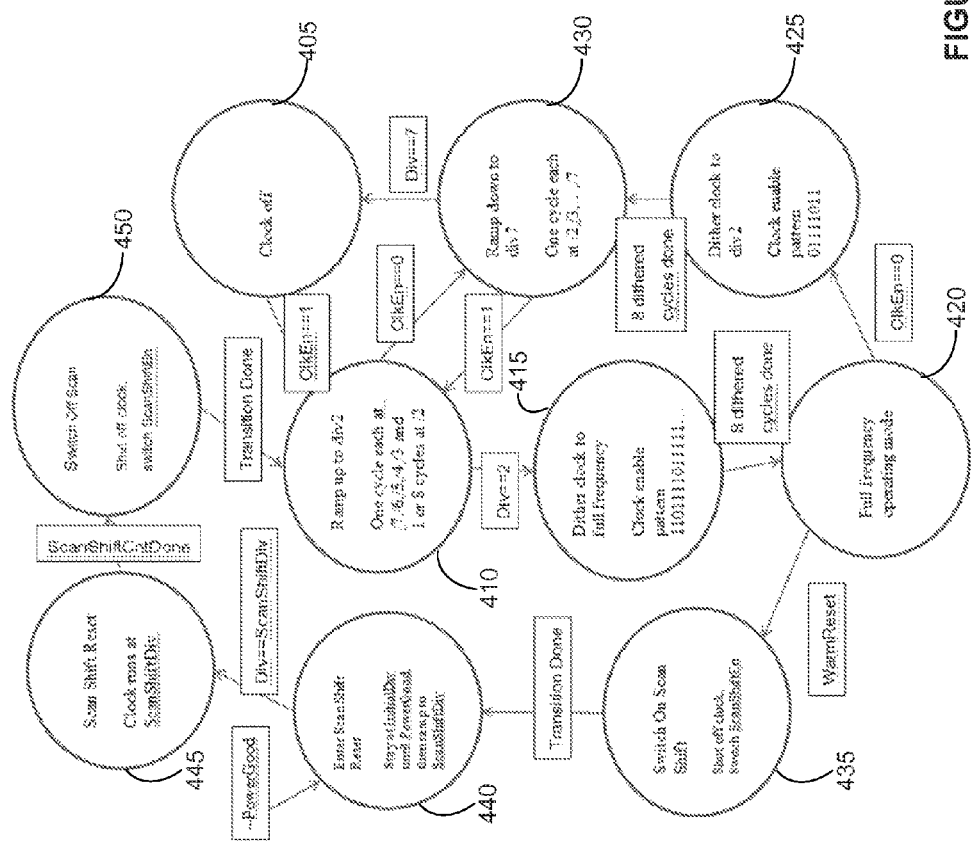
FIG. 5 is a state machine diagram, in accordance with some embodiments of the disclosure.

FIG. 5 presents a state machine diagram according to some embodiments of the present disclosure. In state 405, a clock having a reference clock frequency $n_{ref}$ is off. Upon receiving a first signal to enable the clock, e.g., ClkEn=1, state 410 is entered, wherein the clock ramps up from $n_{ref}/7$ to $n_{ref}/2$. In one embodiment, ramping up may comprise one cycle at a divisor from 7 to 3, decrementing the divisor, and one or eight cycles at a divisor of 2. Thereafter, and in the absence of countermanding signals, state 415 is entered, wherein the clock is dithered up from $n_{ref}/2$ to $n_{ref}$.

For example, $n_{ref}/2$ can be considered to be the same as $n_{ref}$ with alternating clock cycles disabled. Continuing this example, if the clock enable pattern of $n_{ref}$ were 1111111111 . . . (i.e., every clock cycle, or 100% of clock cycles, would be enabled), the clock enable pattern of $n_{ref}/2$ might then be 1010101010 . . . (i.e., every other clock cycle, or about 50% of clock cycles, would be enabled). Dithering up from $n_{ref}/2$ to $n_{ref}$ may then comprise applying a clock enable pattern intermediate between the two patterns set forth above, i.e., a clock enable pattern having from about 50% to 100% of clock cycles enabled, with more cycles being enabled later in the dithering up process. For example, dithering up may comprise application of a clock enable pattern 1101111011111 . . . .

Dithering may be performed for a desired, programmed number of cycles, e.g., eight cycles. Thereafter, state 420 is entered, wherein the clock operates at $n_{ref}$.

From state 420, upon receiving a second signal to disable the clock, e.g., ClkEn=0, state 425 is entered, wherein the clock is dithered down from $n_{ref}$ to $n_{ref}/2$. Dithering down from $n_{ref}$ to $n_{ref}/2$ may comprise applying a clock enable pattern intermediate between the two patterns set forth above, i.e., a clock enable pattern having from about 50% to 100% of clock cycles enabled, with fewer cycles being enabled later in the dithering down process. For example, dithering down may comprise application of a clock enable pattern 01111011 . . . . Dithering may be performed for a desired, programmed number of cycles, e.g., eight cycles. Thereafter, state 430 is entered, wherein the clock is ramped down from $n_{ref}/2$ to $n_{ref}/7$. In one embodiment, ramping down may comprise one cycle at a divisor from 2 to 7, and incrementing the divisor. Thereafter, state 405 is entered, and the clock is disabled.

The first signal to enable the clock may be received in state 430, such as a time between cycling and incrementing the divisor, and then state 410 may be entered. After entry of state 410 from state 430, ramping up may begin with a divisor of 7, or it may begin with a divisor equal to the last value of the divisor in state 430. Upon completion of ramping up in state 410, the system may enter state 415, then state 420, as described above. An example waveform relating to the transitions from state 405 to state 410, state 410 to state 415, and/or state 415 to state 420, is shown in FIG. 3E.

The second signal to disable the clock may be received in state 410, such as a time between cycling and decrementing the divisor, and then state 430 may be entered. After entry of state 430 from state 410, ramping down may begin with a divisor of 2, or it may begin with a divisor equal to the last value of the divisor in state 410. Upon completion of ramping down in state 430, the system may enter state 405, as described above.

In state 420, a third signal (e.g., WarmReset) may be received to warm reset the clock. In response, state 435 may be entered, wherein the clock is disabled. Thereafter, state 440 may be entered, wherein a scan shift reset having a first divisor may be entered. The system may remain in state 440 until an indication of good power is received, at which time state 445 may be entered. An example waveform relating to the transitions from state 420 to state 435, state 435 to state 440, and/or state 440 to state 445, is shown in FIG. 3C. Another example waveform relating to the transition from state 440 to state 445 is shown in FIG. 3A. In state 445, the scan shift is reset to a second divisor. The system may remain in state 445 until the scan shift is completed, at which time state 450 may be entered. In state 450, the scan shift may be exited. Thereafter, state 410 may be entered, with subsequent transitions to state 415 and 420 (or 430 and 405), as described above. An example waveform relating to the transitions from state 445 to state 450, state 450 to state 410, state 410 to state 415, and/or state 415 to state 420 is shown in FIG. 3B. An example waveform relating to the transitions from state 420 to state 425, state 425 to state 430, and/or state 430 to state 405, is shown in FIG. 3D.

FIG. 6 presents a flowchart depicting a method 500 according to some embodiments of the present disclosure. The method 500 may comprise: receiving at 510 a signal to adjust a clock from a first rate to a second rate; and ramping at 520 the clock from the first rate to the second rate, wherein the ramping comprises changing the frequency of the clock to at least one third rate between the first and second rates. In some embodiments, ramping comprises sequentially changing the frequency of the clock to a plurality of third rates. Changing the frequency of the clock may comprise changing a multiplier of the first rate.

In some embodiments, the first rate, the second rate, and the third rate are related to a reference clock rate such that the first rate equals a first multiplier times the reference clock rate, the second rate equals a second multiplier times the reference clock rate, and the third rate equals a third multiplier times the reference clock rate. In some embodiments, each of the first multiplier, the second multiplier, and the third multiplier are independently an integer from 0 to about 10 or the inverse of an integer from 1 to about 10.

The method 500 may further comprise dithering 530 the clock from the third rate to the second rate.

The method 500 may be performed to bring the clock from a starting clock rate, e.g., the reference clock rate $n_{ref}$, to a final clock rate of zero (e.g., disabling the clock). Alternatively, the method 500 may be performed to bring the clock from a clock rate of zero to a final clock rate, such as the reference clock rate $n_{ref}$ (e.g., enabling the clock). In some embodiments, the clock may be brought from the first rate to the second rate in from 10 cycles to 100 cycles of the reference clock. By doing so, the clock may be quickly brought to full speed while mitigating a dI/dT event associated with the clock speed increase.

When enabling the clock, the plurality of third rates may be related to the second rate by the multipliers ⅐, ⅙, ⅕, ¼, ⅓, and ½, and the first rate may be related to the second rate by the multiplier 0.

When disabling the clock, the plurality of third rates may be related to the first rate by the multipliers ½, ⅓, ¼, ⅕, ⅙, and ⅐, and the second rate may be related to the first rate by the multiplier 0.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   receiving a signal to adjust a clock having a first rate to a second rate, wherein the first rate is zero and the second rate is a reference clock rate, and wherein the first rate, the second rate, and a third rate are related to the reference clock rate such that the first rate equals a first multiplier times the reference clock rate, the second rate equals a second multiplier times the reference clock rate, and the third rate equals a third multiplier times the reference clock rate;
   ramping, in response to receiving the signal, the clock from the first rate to the second rate, wherein the ramping comprises changing the frequency of the clock to at least one third rate between the first and second rates;
   dithering up the clock from a third clock rate equal to the reference clock rate divided by 2 to the second rate; and
   operating the clock at the second rate.

2. The method of claim 1, wherein changing the frequency of the clock comprises changing a multiplier of the first rate.

3. The method of claim 1, wherein each of the first multiplier, the second multiplier, and the third multiplier are independently an integer from 0 to about 10 or the inverse of an integer from 1 to about 10.

4. The method of claim 1, wherein the ramping comprises sequentially changing the frequency of the clock to a plurality of third rates.

5. The method of claim 4, wherein the plurality of third rates are related to the second rate by the multipliers $1/7$, $1/6$, $1/5$, $1/4$, $1/3$, and $1/2$, and the first rate is related to the second rate by the multiplier 0.

6. The method of claim 1, wherein the clock is ramped from the first rate to the second rate in from 10 cycles to 100 cycles of the reference clock.

7. The method of claim 1, wherein ramping comprises ramping up the clock from the reference clock rate divided by 7 to the reference clock rate divided by 2.

8. An apparatus, comprising:
    a clock having a first rate and capable of being adjusted to a second rate and at least one third rate between the first and second rates; and
    a processor configured to:
    receive a signal to adjust a clock having a first rate to a second rate, wherein the first rate is zero and the second rate is a reference clock rate, and wherein the first rate, the second rate, and a third rate are related to the reference clock rate such that the first rate equals a first multiplier times the reference clock rate, the second rate equals a second multiplier times the reference clock rate, and the third rate equals a third multiplier times the reference clock rate;
    ramp, in response to receiving the signal, the clock from the first rate to the second rate, wherein the ramping comprises changing the frequency of the clock to at least one third rate between the first and second rates;
    dither up the clock from a third clock rate equal to the reference clock rate divided by 2 to the second rate; and
    operate the clock at the second rate.

9. The apparatus of claim 8, wherein the processor is configured to change the frequency of the clock by changing a multiplier of the first rate.

10. The apparatus of claim 8, wherein each of the first multiplier, the second multiplier, and the third multiplier are independently an integer from 0 to about 10 or the inverse of an integer from 1 to about 10.

11. The apparatus of claim 8, wherein the processor is configured to ramp by sequentially changing the frequency of the clock to a plurality of third rates.

12. The apparatus of claim 11, wherein the plurality of third rates are related to the second rate by the multipliers $1/7$, $1/6$, $1/5$, $1/4$, $1/3$, and $1/2$, and the first rate is related to the second rate by the multiplier 0.

13. The apparatus of claim 8, wherein the clock is ramped from the first rate to the second rate in from 10 cycles to 100 cycles of the reference clock.

14. The apparatus of claim 8, wherein the processor is configured to ramp up the clock from the reference clock rate divided by 7 to the reference clock rate divided by 2.

15. A non-transitory computer readable storage medium encoded with data that, when implemented in a manufacturing facility, adapts the manufacturing facility to create an apparatus, comprising:
    a clock having a first rate and capable of being adjusted to a second rate and at least one third rate between the first and second rates; and
    a processor configured to:
    receive a signal to adjust a clock having a first rate to a second rate, wherein the first rate is zero and the second rate is a reference clock rate, and wherein the first rate, the second rate, and a third rate are related to the reference clock rate such that the first rate equals a first multiplier times the reference clock rate, the second rate equals a second multiplier times the reference clock rate, and the third rate equals a third multiplier times the reference clock rate;
    ramp, in response to receiving the signal, the clock from the first rate to the second rate, wherein the ramping comprises changing the frequency of the clock to at least one third rate between the first and second rates;
    dither up the clock from a third clock rate equal to the reference clock rate divided by 2 to the second rate; and
    operate the clock at the second rate.

16. The non-transitory computer readable program storage unit of claim 15, wherein the processor is configured to ramp up the clock from the reference clock rate divided by 7 to the reference clock rate divided by 2.

\* \* \* \* \*